(12) United States Patent
Oi et al.

(10) Patent No.: US 9,530,744 B2
(45) Date of Patent: Dec. 27, 2016

(54) SEMICONDUCTOR DEVICE AND METHOD OF MANUFACTURING THE SAME

(71) Applicant: SHINKO ELECTRIC INDUSTRIES CO., LTD., Nagano-shi (JP)

(72) Inventors: Kiyoshi Oi, Nagano (JP); Satoshi Otake, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 77 days.

(21) Appl. No.: 14/554,550

(22) Filed: Nov. 26, 2014

(65) Prior Publication Data
US 2015/0228551 A1 Aug. 13, 2015

(30) Foreign Application Priority Data
Feb. 10, 2014 (JP) .................. 2014-023101

(51) Int. Cl.
*H01L 29/40* (2006.01)
*H01L 23/00* (2006.01)
(Continued)

(52) U.S. Cl.
CPC .......... *H01L 24/13* (2013.01); *H01L 23/3135* (2013.01); *H01L 23/49811* (2013.01); *H01L 24/16* (2013.01); *H01L 24/91* (2013.01); *H01L 25/105* (2013.01); *H01L 24/11* (2013.01); *H01L 24/73* (2013.01); *H01L 24/81* (2013.01); *H01L 24/83* (2013.01); *H01L 2224/0345* (2013.01); *H01L 2224/03464* (2013.01); *H01L 2224/03912* (2013.01); *H01L 2224/0401* (2013.01); *H01L 2224/05023* (2013.01); *H01L 2224/05124* (2013.01); *H01L 2224/05147* (2013.01); *H01L 2224/05166* (2013.01); *H01L 2224/05568* (2013.01); *H01L 2224/05647* (2013.01); *H01L 2224/11462* (2013.01); *H01L 2224/11472* (2013.01); *H01L 2224/11849* (2013.01); *H01L 2224/13017* (2013.01);
(Continued)

(58) Field of Classification Search
CPC ................ H01L 24/13; H01L 24/16
See application file for complete search history.

(56) References Cited

U.S. PATENT DOCUMENTS 9,036,362 B2 * 5/2015 Tanaka et al. ............... 361/762
2004/0201096 A1 * 10/2004 Iijima et al. .................. 257/734
(Continued)

FOREIGN PATENT DOCUMENTS

| JP | H07-211722 | 8/1995 |
|---|---|---|
| JP | 2013-187353 A1 | 9/2013 |

*Primary Examiner* — Zandra Smith
*Assistant Examiner* — Evan Clinton
(74) *Attorney, Agent, or Firm* — Kratz, Quintos & Hanson, LLP

(57) ABSTRACT

A semiconductor device includes a wiring substrate including a first electrode in which a cross-sectional shape is an inverted trapezoidal shape, a semiconductor chip including a second electrode in which a cross-sectional shape is an inverted trapezoidal shape, a metal bonding material bonding a tip end of the first electrode and a tip end of the second electrode which face each other, and an underfill resin filled between the wiring substrate and the semiconductor chip, the underfill resin covering a side face of each of the first electrode and the second electrode and a side face of the metal bonding material.

6 Claims, 12 Drawing Sheets

(51) Int. Cl.
*H01L 23/498* (2006.01)
*H01L 23/31* (2006.01)
*H01L 25/10* (2006.01)

(52) U.S. Cl.
CPC ............... *H01L 2224/13082* (2013.01); *H01L 2224/13083* (2013.01); *H01L 2224/13111* (2013.01); *H01L 2224/13147* (2013.01); *H01L 2224/13155* (2013.01); *H01L 2224/16238* (2013.01); *H01L 2224/2919* (2013.01); *H01L 2224/73204* (2013.01); *H01L 2224/8183* (2013.01); *H01L 2224/81191* (2013.01); *H01L 2224/83097* (2013.01); *H01L 2224/83192* (2013.01); *H01L 2224/83862* (2013.01); *H01L 2224/94* (2013.01); *H01L 2924/15313* (2013.01); *H01L 2924/15321* (2013.01)

(56) References Cited

U.S. PATENT DOCUMENTS

| 2005/0023704 | A1* | 2/2005  | Lin et al. ................. 257/781 |
| 2008/0303153 | A1* | 12/2008 | Oi et al. .................. 257/738 |
| 2009/0008765 | A1* | 1/2009  | Yamano et al. ........... 257/690 |
| 2010/0127382 | A1* | 5/2010  | Akahoshi et al. .......... 257/692 |
| 2012/0032335 | A1* | 2/2012  | Kariya et al. ............. 257/772 |
| 2014/0252598 | A1* | 9/2014  | Yu .......................... H01L 24/14 257/737 |

\* cited by examiner (plan view)

(plan view)

(cross-sectional view)

SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2014-023101, filed on Feb. 10, 2014, the entire contents of which are incorporated herein by reference.

FIELD

This invention is related to a semiconductor device and a method of manufacturing the same.

BACKGROUND ART

In recent years, with the advancement in the performance of the semiconductor devices, higher density of the packaging techniques have been advanced. Flip-chip mounting has been widely used as the technique for connecting the semiconductor chip to the wiring substrate. In the flip-chip mounting, first, the electrodes of the semiconductor chip are flip-chip connected to the electrodes of the wiring substrate through the solder. Subsequently, the underfill resin is filled between the semiconductor chip and the wiring substrate.

A related art is disclosed in Japanese Laid-open Patent Publication No. 07-211722, and Japanese Laid-open Patent Publication No. 2013-187353.

SUMMARY

As will be explained in the section of preliminary matter given below, there is a semiconductor device in which electrodes of a semiconductor chip are flip-chip connected to electrodes of a wiring substrate through a solder layer, and an underfill resin is filled between the semiconductor chip and the wiring substrate.

Such semiconductor device has a problem in that when the thermal stress or the like is generated, the detachment is generated easily in respective interfaces between the underfill resin, and the semiconductor chip and the wiring substrate, therefore sufficient reliability of the electrical connection between the semiconductor chip and the wiring substrate cannot be achieved.

According to one aspect discussed herein, there is provided a semiconductor device, including a wiring substrate including a first electrode in which a cross-sectional shape is an inverted trapezoidal shape, a semiconductor chip including a second electrode in which a cross-sectional shape is an inverted trapezoidal shape, a metal bonding material bonding a tip end of the first electrode and a tip end of the second electrode which face each other, and an underfill resin filled between the wiring substrate and the semiconductor chip, the underfill resin covering a side face of each of the first electrode and the second electrode and a side face of the metal bonding material.

Also, according to another aspect discussed herein, there is provided a method of manufacturing a semiconductor device, including preparing a wiring substrate including a first electrode in which a cross-sectional shape is an inverted trapezoidal shape, forming a sealing resin material on a face of the wiring substrate on which the first electrode is formed, preparing a semiconductor chip including a second electrode in which a cross-sectional shape is an inverted trapezoidal shape, and pushing the second electrode of the semiconductor chip into the sealing resin material, and pressure-welding the second electrode of the semiconductor chip to the first electrode of the wiring substrate by a metal bonding material, and performing a heat process, and thereby bonding the second electrode of the semiconductor chip to the first electrode of the wiring substrate by the metal bonding material, and filling an underfill resin formed of the sealing resin material between the wiring substrate and the semiconductor chip, wherein a side face of each of the first electrode and the second electrode and a side face of the metal bonding material are covered with the underfill resin.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Hereinbelow, an embodiment will be explained with reference to the accompanying drawings.

Figure 1:
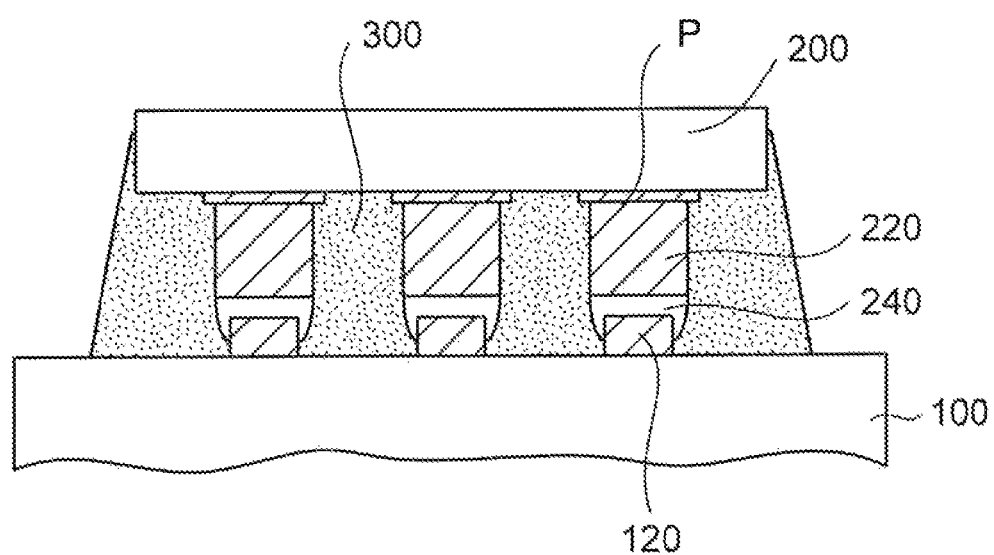
FIG. 1 is a cross-sectional view depicting a semiconductor device according to a preliminary matter.

Prior to the explanation of the embodiment, the preliminary matter to be set forth as a basis will be explained hereunder. FIG. 1 is a cross-sectional view depicting a semiconductor device according to the preliminary matter.

As depicted in FIG. 1, the semiconductor device according to the preliminary matter includes a wiring substrate 100 and a semiconductor chip 200 mounted thereon. Connection electrodes 120 made of copper or the like are formed on the upper face of the wiring substrate 100.

Moreover, columnar electrodes 220 made of copper or the like are formed on the lower face of the semiconductor chip 200 and connected to connection pads P.

Then, the columnar electrodes 220 of the semiconductor chip 200 are flip-chip connected to the connection electrodes 120 of the wiring substrate 100 through a solder layer 240. Furthermore, an underfill resin 300 is filled between the semiconductor chip 200 and the wiring substrate 100.

To such semiconductor device, as reliability tests, a moisture/reflow test in which the moisture adsorption for 40 hours is done under conditions of a temperature of 60° C. and a humidity of 60% and then reflow heating at a temperature of 260° C. is done, and a high-temperature/high-humidity test under conditions of a temperature 130° C. and a humidity of 85%, are performed. According to the test results, the detachment is generated easily in the interface of the underfill resin 300 and the semiconductor chip 200 and in the interface of the underfill resin 300 and the wiring substrate 100.

For this reason, the sufficient reliability of the electrical connection between the semiconductor chip 200 and the wiring substrate 100 cannot be achieved.

This means that failures are generated easily when the semiconductor device is reflow-soldered to the mounting board such as a motherboard with the heat process, and when the electronic apparatus incorporating the semiconductor device is actually used.

The above failures are caused by the matter in which when the heat process is performed to the semiconductor device, the thermal stress is generated due to the difference in the thermal expansion coefficient in the materials of internal parts.

In the semiconductor device according to the preliminary matter, the side face of the columnar electrode 220 of the semiconductor chip 200 has the straight shape that is arranged to the vertical direction. Also, the side face of the connection electrode 120 of the wiring substrate 100 has the straight shape that is arranged to the vertical direction.

For this reason, when the thermal stress that causes the deformation to the upper and lower sides is applied to the semiconductor chip 200 and the wiring substrate 100, the columnar electrodes 220 of the semiconductor chip 200 and the connection electrodes 120 of the wiring substrate 100 fall out easily from the underfill resin 300. As a result, the detachment is generated at the respective interfaces between the semiconductor chip 200 and wiring substrate 100, and the underfill resin 300.

A semiconductor device of the embodiment to be explained below can solve the above failures.

Embodiment

FIG. 2A to FIG. 11 are views depicting a method of manufacturing a semiconductor device of the embodiment. FIG. 12 is a view depicting a semiconductor device of the embodiment. Hereinbelow, while explaining the method of manufacturing a semiconductor device, the structure of the semiconductor device will be explained.

Figure 2A:
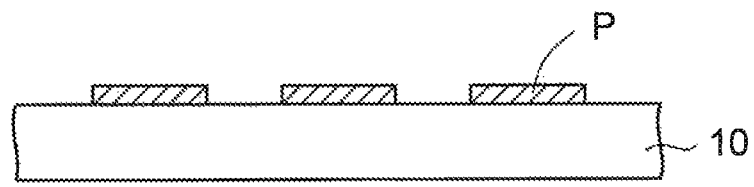
FIGS. 2A to 2C are cross-sectional views depicting a method of manufacturing a semiconductor device of an embodiment (part 1).

At the start, a method of manufacturing a semiconductor chip including columnar electrodes, which is used in the method of manufacturing a semiconductor device of the embodiment, will be explained. As depicted in FIG. 2A, first, a semiconductor wafer 10 is prepared. A silicon wafer is used as a representative example of the semiconductor wafer 10.

In the surface layer of the semiconductor wafer 10, various elements, which are not depicted, such as transistors, capacitors, and resistors, are formed and these elements are connected to multi-layer wirings, thereby the electronic circuit is formed.

Then, connection pads P are formed on the uppermost face of the semiconductor wafer 10, the connection pads P being connected to the multi-layer wirings and exposed from a passivation film (not depicted). The connection pads P of the semiconductor wafer 10 are formed of a wiring material containing aluminum or copper.

Figure 2B:
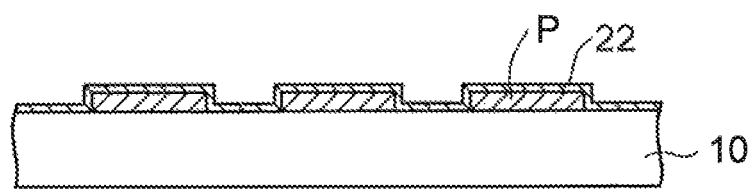

Then, as depicted in FIG. 2B, a seed layer 22 is formed on the semiconductor wafer 10 on which the connection pads P are exposed, by sputtering or electroless plating. As one example of the seed layer 22, a titanium (Ti) layer having a thickness of 0.05 μm and a copper (Cu) layer having a thickness of 0.5 μm are formed in this order from the lower side.

Figure 2C:
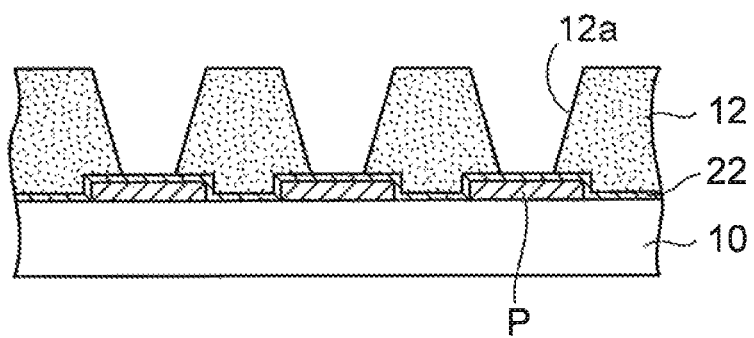

Thereafter, as depicted in FIG. 2C, a resist material (not depicted) is coated on the seed layer 22, and exposed through a photomask (not depicted) and then the development is performed on the basis of the photolithography. By this matter, a resist layer 12 is formed on the seed layer 22, the resist layer 12 in which opening portions 12a are provided on the connection pads P.

At this time, in the case that a positive resist material is used, the exposure, the structure of the photomask, and the like are adjusted such that the amount of exposure in the exposing part of the resist layer 12 decreases remarkably as the height position is located from the upper part to the lower part.

By this matter, the cross-sectional shape of the opening portion 12a of the resist layer 12 is formed with an inverted trapezoidal shape in which the width becomes narrower from the tip end toward the base end.

Figure 3A:
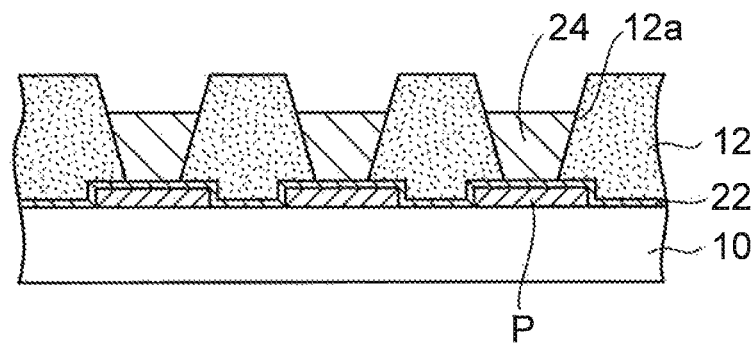
FIGS. 3A to 3C are cross-sectional views depicting the method of manufacturing a semiconductor device of the embodiment (part 2).

Then, as depicted in FIG. 3A, a copper (Cu) plating layer 24 is formed in the opening portions 12a of the resist layer 12 by electroplating using the seed layer 22 as a plating power feeding path.

Figure 3B:
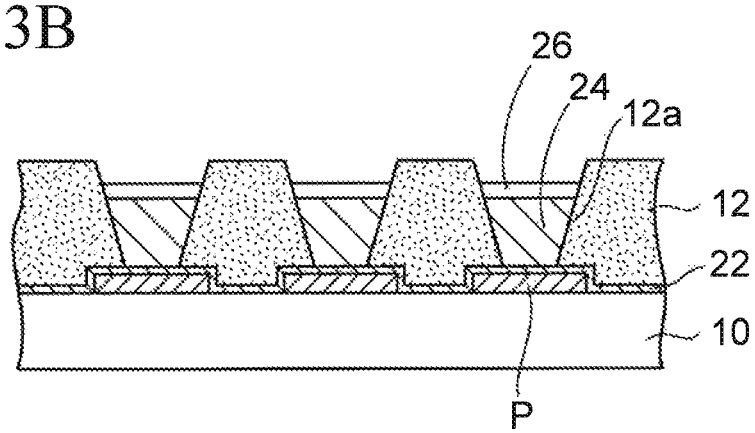

Further, as depicted in FIG. 3B, a solder layer 26 is formed on the copper plating layer 24 by similar electroplating. As the solder layer 26, tin (Sn) silver (Ag)-based solder, or tin (Sn) bismuth (Bi)-based solder is used, for example. The solder layer 26 is one example of a metal bonding material.

Figure 3C:
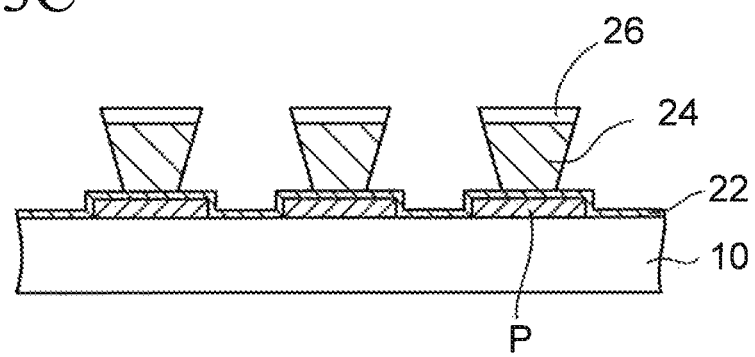

Thereafter, as depicted in FIG. 3C, the resist layer 12 is removed to expose the seed layer 22.

Figure 4A:
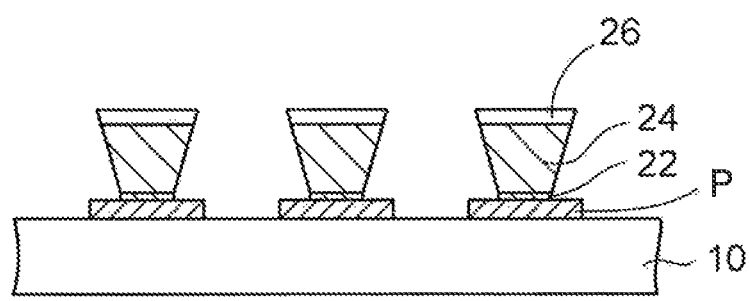
FIGS. 4A and 4B are cross-sectional views depicting the method of manufacturing a semiconductor device of the embodiment (part 3).
Figure 4B:
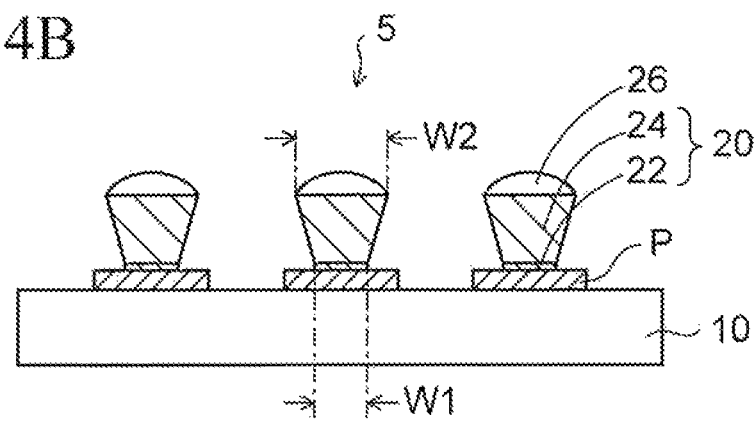

Then, as depicted in FIG. 4A, the seed layer 22 is removed by wet etching while using the solder layer 26 and the copper plating layer 24 as a mask. Further, as depicted in FIG. 4B, a heat process is performed to reflow the solder layer 26 and make it a bump like shape whose surface is rounded. By this matter, it is in a state that columnar electrodes 20 are formed from the seed layer 22 and the copper plating layer 24 in this order from the lower side, and the solder layer 26 is arranged on the tip face of columnar electrodes 20.

Thereafter, the semiconductor wafer 10 is cut along dicing lines, thereby individual semiconductor chips 5 are obtained.

In this way, the columnar electrodes 20 are formed to protrude on the connection pads P of the semiconductor chip 5. The height of the columnar electrode 20 of the semiconductor chip 5 excluding the solder layer 26 is set to about 20 μm, for example.

As mentioned above, the copper plating layers 24 of the columnar electrodes 20 are formed in the opening portions 12a of the resist layer 12, the opening portions 12a in which the cross-sectional shape is the inverted trapezoidal shape. For this reason, the cross-sectional shape of the columnar electrode 20 is formed with the inverted trapezoidal shape in which the width becomes narrower from the tip end toward the base end.

As depicted in FIG. 4B, in the cross-sectional shape of the columnar electrode 20 of the semiconductor chip 5, the width W1 of the base end is narrower than the width 2 of the tip end. The columnar electrode 20 of the semiconductor chip 5 is a pad-shaped electrode arranged like the islands, and has an inverted circular truncated cone like shape in a perspective view. The width W1 (diameter) of the base end of the columnar electrode 20 of the semiconductor chip 5 is about 20 μm, and the width W2 (diameter) of the tip end is about 25 μm, for example.

Moreover, the columnar electrodes 20 of the semiconductor chip 5 may be arranged with an area array arrangement in which they are arranged in a grid-like pattern on the entire area of the chip, or with a peripheral arrangement in which they are arranged on the periphery of the chip.

As will be described later, since the columnar electrodes 20 of the semiconductor chip 5 have the inverted trapezoidal shape in the cross-sectional shape which becomes narrower from the tip end toward the base end, the columnar electrode 20 can function as an anchor to an underfill resin. Therefore, it is prevented that the columnar electrode 20 falls out from the underfill resin.

By the above steps, the semiconductor chip 5 including the columnar electrodes 20 which become narrower from the tip end toward the base end is manufactured.

Figure 5A:
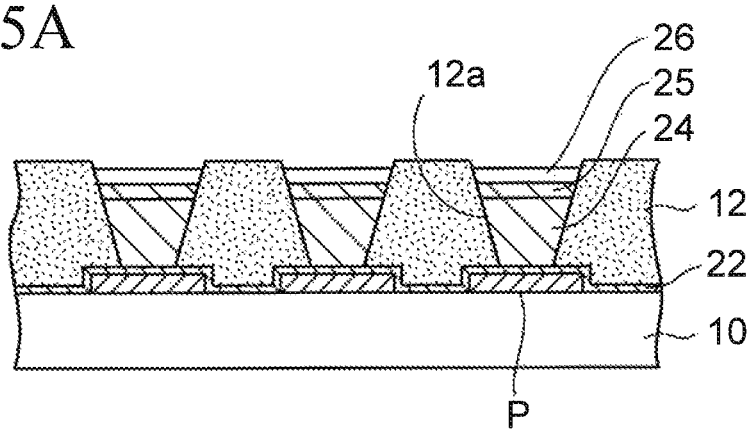
FIGS. 5A to 5C are cross-sectional views depicting the method of manufacturing a semiconductor device of the embodiment (part 4).
Figure 5B:
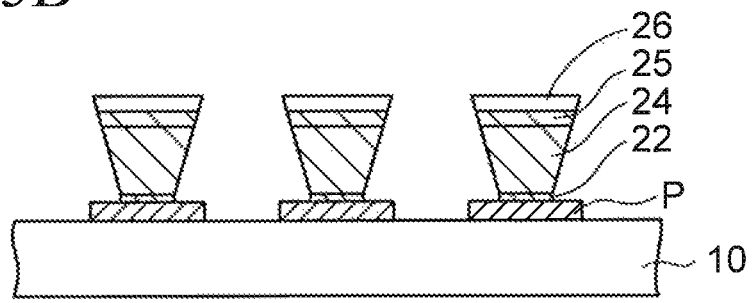
Figure 5C:
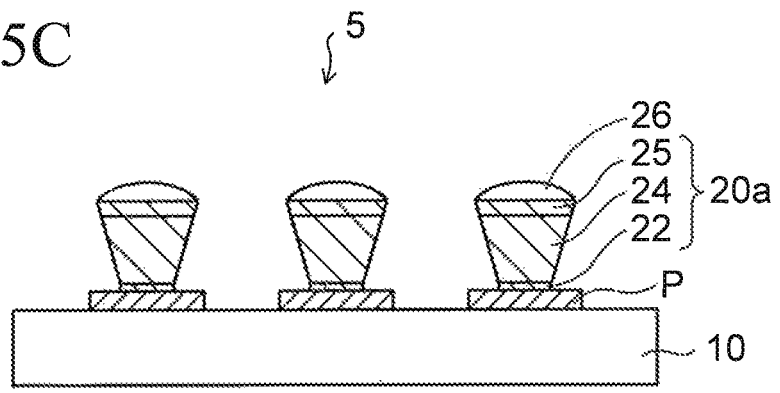

FIGS. 5A to 5C depict a modification of the columnar electrodes of the semiconductor chip. As depicted in FIG. 5A, after the step in FIG. 3A mentioned above, a nickel (Ni) layer 25 having a thickness of about 3 μm may be formed on the copper plating layer 24, and the solder layer 26 may be formed on the nickel layer 25.

Then, as depicted in FIG. 5B, similarly to the steps in FIG. 3 and FIG. 4A mentioned above, the resist layer 12 is removed and then the seed layer 22 is wet-etched.

Thereafter, as depicted in FIG. 5C, similarly to FIG. 4B mentioned above, the solder layer 26 is reflowed to round the surface and make the solder layer 26 a bump shape. Then, similarly the semiconductor wafer 10 is cut to obtain individual semiconductor chips 5.

It is in a state that the columnar electrode 20a of the semiconductor chip 5 in FIG. 5C is formed of the seed layer 22, the copper plating layer 24, and the nickel layer 25 in this order from the lower side, and the solder layer 25 is arranged on the columnar electrode 20a. The nickel layer 25 functions as a barrier layer which prevents reactions between the copper plating layer 24 and the solder layer 26.

In this way, in the case that there is a possibility that the copper plating layer 24 and the solder layer 26 react each other and cause a connection failure in the step of reflow-soldering the semiconductor chip 5 later, or the like, the nickel layer 25 may be formed as the barrier layer between the copper plating layer 24 and the solder layer 26.

In this embodiment, as examples of a second electrode which the semiconductor chip includes, the columnar electrode 20 (FIG. 4B) and the columnar electrode 20a (FIG. 5C) of the semiconductor chip 5 mentioned above are illustrated.

Next, a method of manufacturing a wiring substrate including connection electrodes, which is used in the method of manufacturing a semiconductor device of the embodiment, will be explained.

Figure 6A:
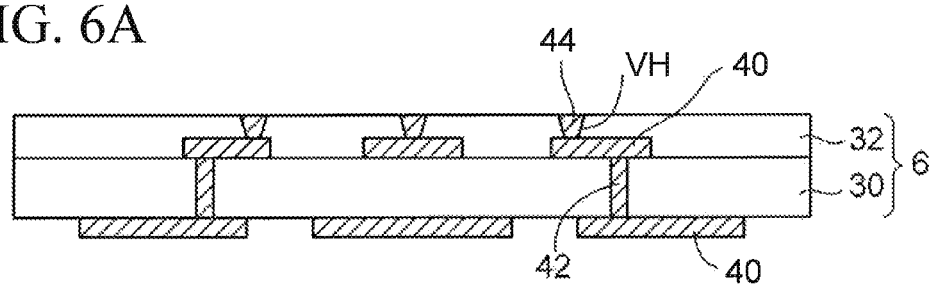
FIGS. 6A to 6D are cross-sectional views depicting the method of manufacturing a semiconductor device of the embodiment (part 5).

First, a wiring substrate 6 as depicted in FIG. 6A is prepared. In the wiring substrate 6, wiring layers 40 are formed on both faces of an insulating substrate 30 respectively. Penetrating electrodes 42 which penetrate in the thickness direction are formed in the insulating substrate 30. The wiring layers 40 on both faces are connected each other through the penetrating electrodes 42.

An insulating layer 32 is formed on the insulating substrate 30, the insulating layer 32 in which via holes VH are arranged on the wiring layer 40. A via electrode 44 is filled in the via hole VH and connected to the wiring layer 40.

Figure 6B:
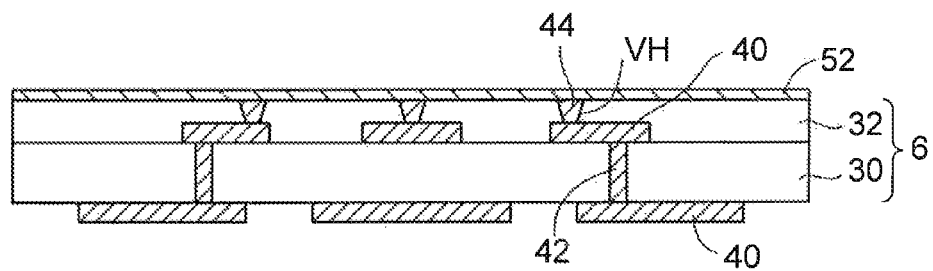

Then, as depicted in FIG. 6B, a seed layer 52 made of copper or the like is formed on the insulating layer 32 and the via electrodes 44 by electroless plating or sputtering.

Figure 6C:
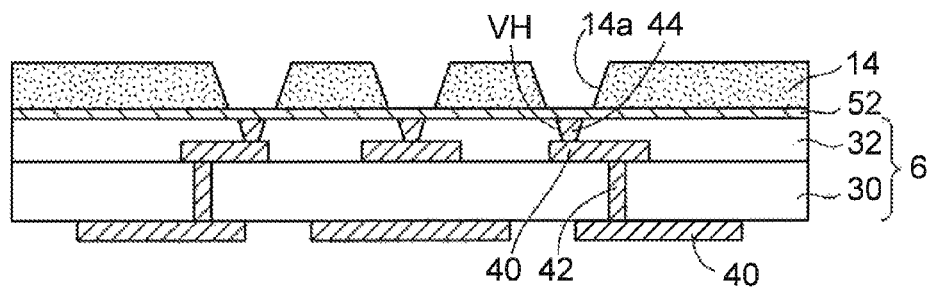

Thereafter, as depicted in FIG. 6C, a resist layer 14 in which opening portions 14a are provided on the seed layer 52 in the region including the via electrodes 44, is formed. In this step, similarly to the step in FIG. 2C mentioned above, the cross-sectional shape of the opening portion 14a of the resist layer 14 is formed with the inverted trapezoidal shape in which the width becomes narrower from the tip end toward the base end.

Figure 6D:
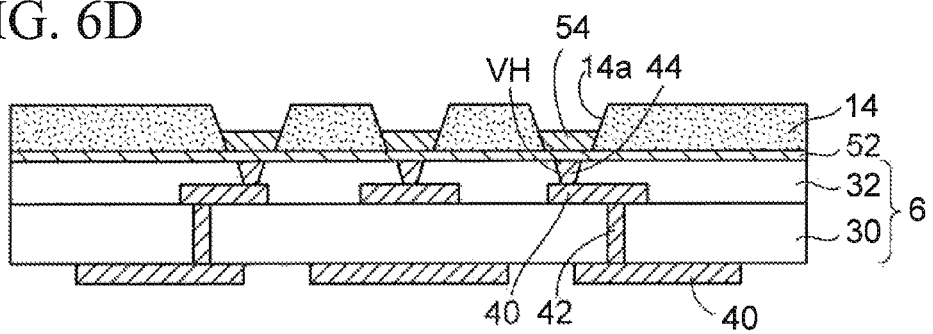
Figure 7A:
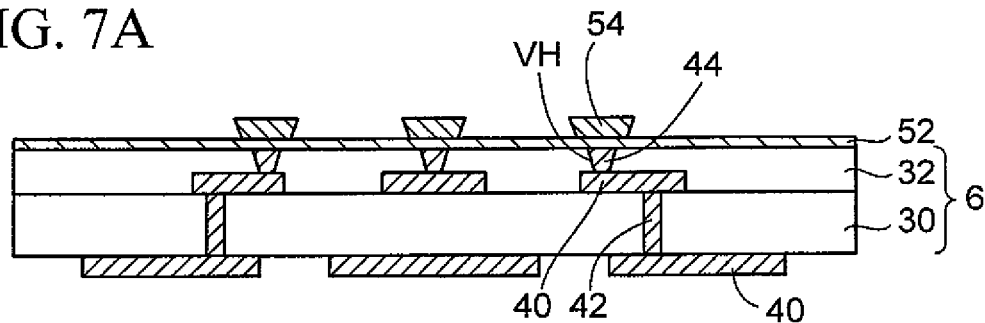
FIGS. 7A and 7B are cross-sectional views and a plan view depicting the method of manufacturing a semiconductor device of the embodiment (part 6).

Subsequently, as depicted in FIG. 6D, a copper plating layer 54 is formed in the opening portions 14a of the resist layer 14 by electroplating using the seed layer 52 as a plating power feeding path. Then, as depicted in FIG. 7A, the resist layer 14 is removed to expose the seed layer 52.

Figure 7B:
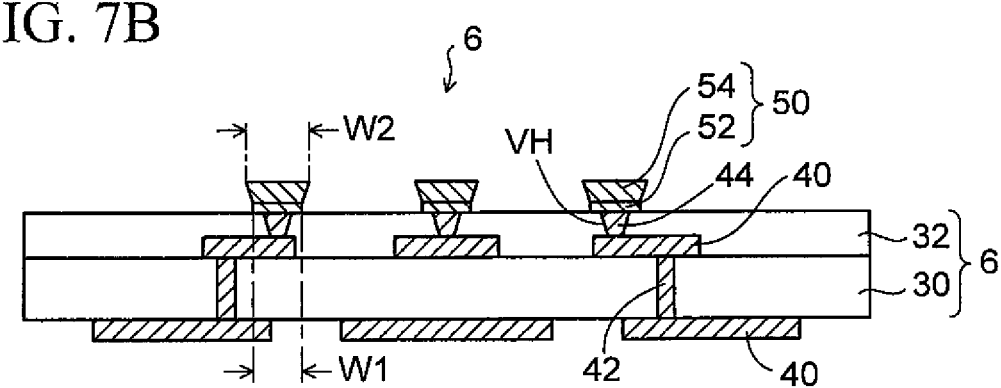
Figure 7B:
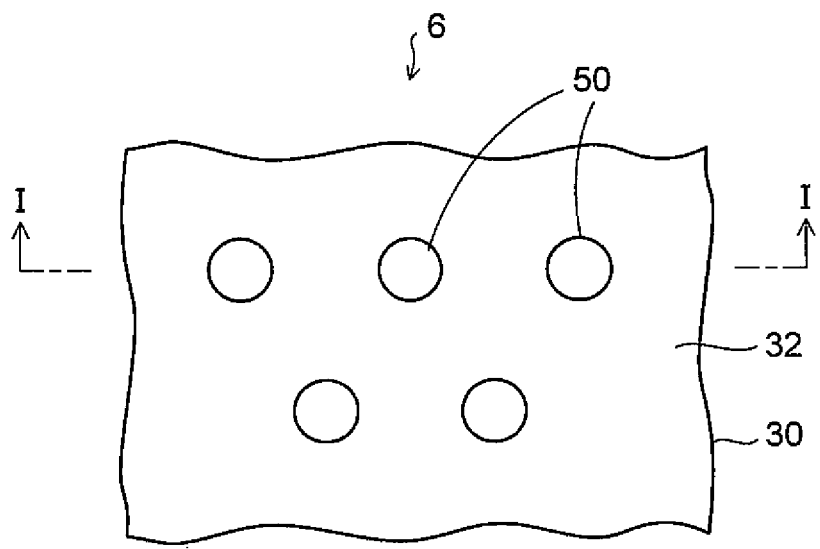

Thereafter, as depicted in FIG. 7B, the seed layer 52 is removed by wet etching while using the copper plating layer 54 as a mask.

By this matter, connection electrodes 50 formed of the seed layer 52 and the copper plating layer 54 are formed to protrude on the via electrodes 44 of the wiring substrate 6. The height of the connection electrode 50 of the wiring substrate 6 is set to about 10 μm, for example.

As mentioned above, the copper plating layers 54 of the connection electrodes 50 are formed in the opening portions 14a of the resist layer 14, the opening portions 14a in which the cross-sectional shape is the inverted trapezoidal shape. For this reason, the cross-sectional shape of the connection electrode 50 is formed with the inverted trapezoidal shape in which the width becomes narrower from the tip end toward the base end. As depicted in FIG. 7B, in the cross-sectional shape of the connection electrode 50, a width W1 of the base end is set narrower than a width W2 of the tip end.

In the example of FIG. 7B, referring to the plan view additionally, the connection electrodes 50 of the wiring substrate 6 are formed on the via electrodes 44 as the pad-shaped electrodes arranged like the islands, respectively, and have the inverted circular truncated cone like shape in the perspective view. The cross-sectional view of the upper side of FIG. 7B corresponds to a cross section taken along line I-I in the plan view in FIG. 7B.

The width W1 (diameter) of the base end of the connection electrode 50 of the wiring substrate 6 is about 20 μm, and the width W2 (diameter) of the tip end is about 25 μm, for example.

By the above steps, the wiring substrate 6 including the connection electrodes 50 which become narrower from the tip end toward the base end is manufactured.

Figure 8A:
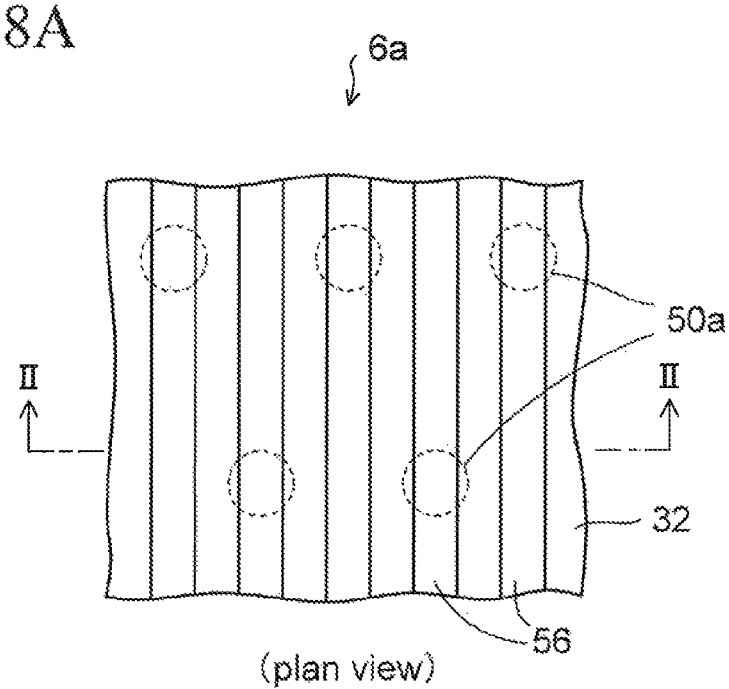
FIGS. 8A and 8B are a cross-sectional view and a plan view depicting the method of manufacturing a semiconductor device of the embodiment (part 7).
Figure 8B:
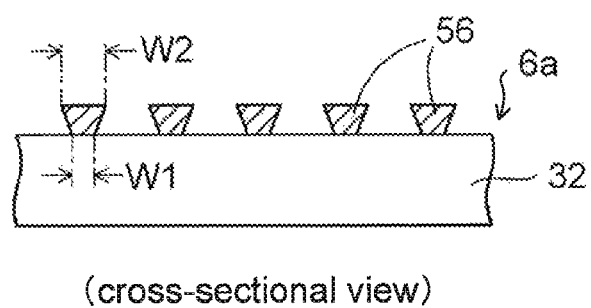

FIGS. 8A and 8B depict the connection electrodes of a wiring substrate 6a of a modification. As depicted in the plan view of FIG. 8A, a predetermined one part of each wiring layer 56 extending like a line with the same wiring width may be formed as a connection electrode portion 50a. The part of each wiring layer 56 circled by a dotted line in FIG. 8A is defined as the connection electrode portion 50a. FIG. 8B is a cross-sectional view taken along line II-II of FIG. 8A.

As depicted in the cross-sectional view of FIG. 8B, the cross-sectional shape of the wiring layer 56 in the width direction is formed with the inverted trapezoidal shape in which the width becomes narrower from the tip end toward the base end, and the cross-sectional shape of the connection electrode portion 50a is formed with the same inverted trapezoidal shape as well. A width W1 of the base end of the cross-sectional shape of the connection electrode portion 50a is set narrower than a width W2 of the tip end.

In the case of forming the wiring layers 56 having the inverted trapezoidal shape including the connection electrode portions 50a in FIGS. 8A and 8B, in the step in FIG. 6C mentioned above, the opening portions 14a of the resist layer 14 may be formed to be extended like a line shape so as to correspond to the wiring layers 56.

The wiring layers 56 including the connection electrode portions 50a of the wiring substrate 6a in FIGS. 8A and 8B also have the cross-sectional shape which becomes narrower from the tip end toward the base end. Therefore, the wiring layers 56 can function as the anchor to the underfill resin. Accordingly, it is prevented that the underfill resin fails out from the wiring layers 56 including the connection electrode portions 50a.

In this embodiment, as the first electrode which the wiring substrate includes, the pad-shaped connection electrodes 50 (FIG. 7B) of the wiring substrate 6 mentioned above and the connection electrode portions 50a (FIGS. 8A and 8B) of the wiring layers 56 of the wiring substrate 6a are illustrated.

Next, a method of connecting the columnar electrodes 20 of the semiconductor chip 5 in FIG. 4B mentioned above and the connection electrodes 50 of the wiring substrate 6 in FIG. 7B mentioned above through a sealing resin material will be explained.

Figure 9:
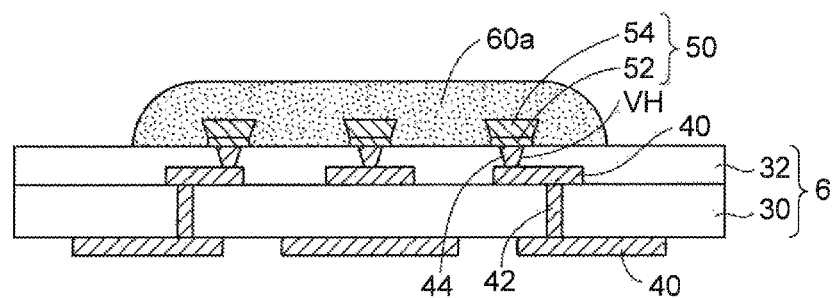
FIG. 9 is a cross-sectional view depicting the method of manufacturing a semiconductor device of the embodiment (part 8).

As depicted in FIG. 9, first, a sealing resin material 60a of the type applied in advance is formed on the face of the wiring substrate 6 in FIG. 7B mentioned above on which the connection electrodes 50 are formed.

As the sealing resin material 60a, a liquid resin material (NCP (Non Conductive Paste)) of epoxy resin or the like, or an uncured (B-stage) resin film (NCF (Non Conductive Film)) of epoxy resin or the like is used.

Figure 10:
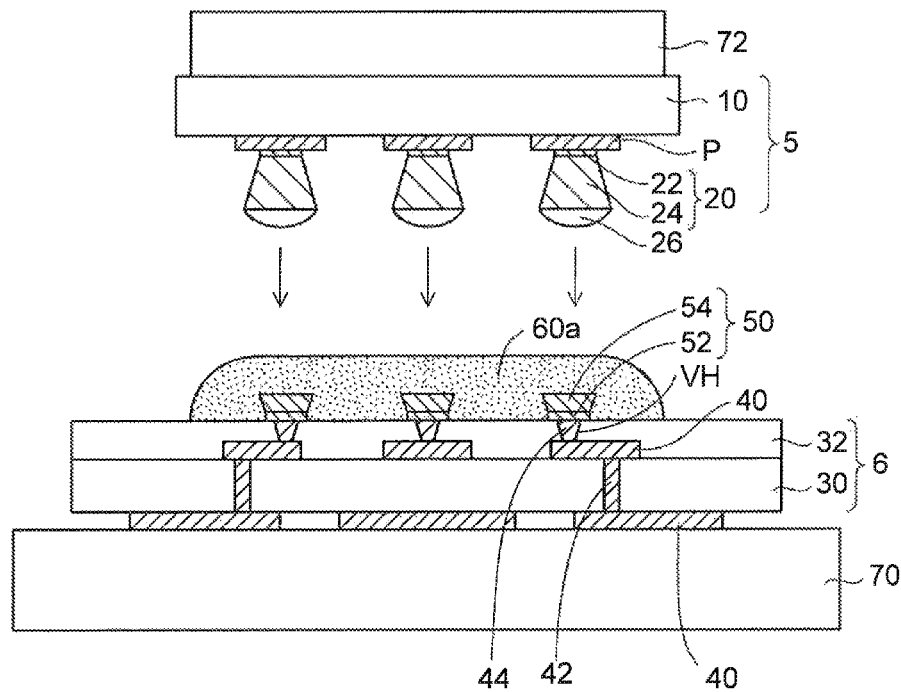
FIG. 10 is a cross-sectional view depicting the method of manufacturing a semiconductor device of the embodiment (part 9).

Then, as depicted in FIG. 10, the wiring substrate 6 in FIG. 9 is arranged on a bonding stage 70. Thereafter, the wiring substrate 6 is heated up to about 100° C., thereby it is in a state that the sealing resin material 60a is softened.

Further, the semiconductor chip 5 in FIG. 4B mentioned above is prepared which includes the columnar electrodes 20 that the solder layer 26 is formed on the tip end. Then, the back face of the semiconductor chip 5 is fixed to a bonding tool 72 by suction, and the columnar electrodes 20 of the semiconductor chip 5 are pushed into the sealing resin material 60a on the wiring substrate 6.

Figure 11:
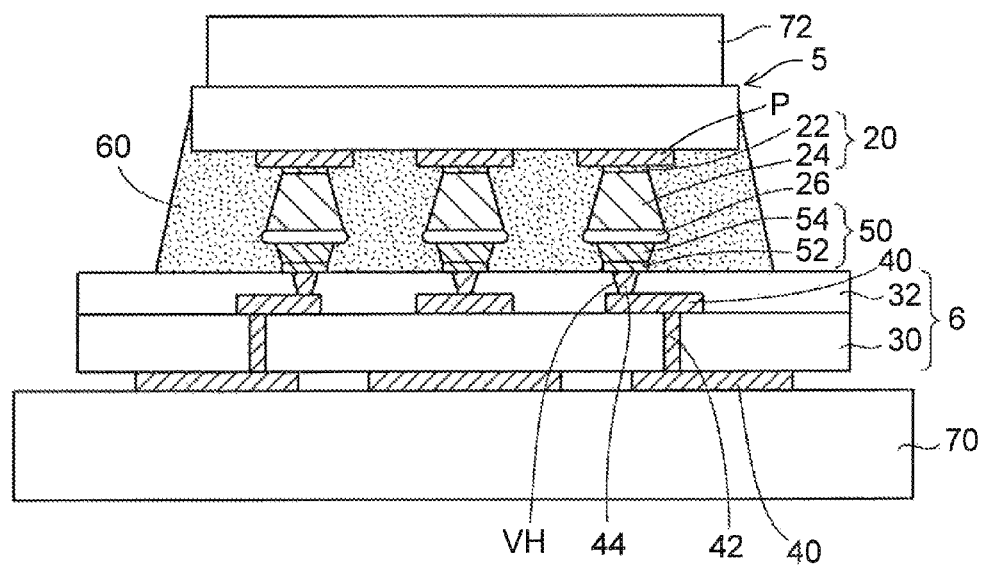
FIG. 11 is a cross-sectional view depicting the method of manufacturing a semiconductor device of the embodiment (part 10).
Figure 12:
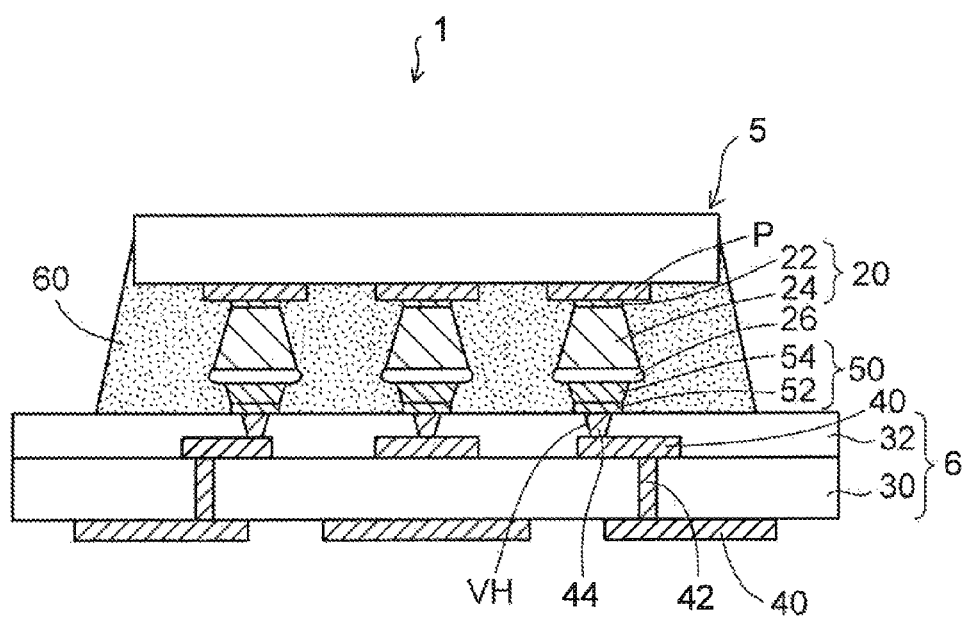
FIG. 12 is a cross-sectional view depicting a semiconductor device of the embodiment (part 1).

By this matter, as depicted in FIG. 11, the columnar electrodes 20 of the semiconductor chip 5 are pressure-welded onto the connection electrodes 50 of the wiring substrate 6 through the solder layer 26, thus the semiconductor chip 5 is flip-chip mounted.

In this step, the mounting is preferably performed such that the center axis of the columnar electrode 20 of the semiconductor chip 5 and the center axis of the connection electrode 50 of the wiring substrate 6 coincide each other. However, if the shift of the center axis is within a range in which no short circuit is generated between the adjoined columnar electrodes 20 or the adjoined connection electrodes 50, the center axes may be shifted and the mounting may be performed.

Thereafter, by reflow heating and melting the solder layer 26, the columnar electrode 20 of the semiconductor chip 5 is bonded to the connection electrode 50 of the wiring substrate 6 by the solder layer 26. When the reflow heating is performed, the uncured sealing resin material 60a is cured at the same time, thereby a cured underfill resin 60 is filled between the semiconductor chip 5 and the wiring substrate 6.

In this step, the solder layer 26 between the columnar electrode 20 of the semiconductor chip 5 and the connection electrode 50 of the wiring substrate 6 is made not to spread around to the respective side faces of the columnar electrode 20 and the connection electrode 50. For this reason, a solid phase bonding method is employed in which the bonding is performed in a state that the solder layer 26 is not completely melted.

In the solid phase bonding, the columnar electrode 20 and the connection electrode 50 are bonded by performing the reflow heating at a temperature lower than the melting point of the solder layer 26. In the case that the solder layer 26 is made of tin silver-based solder, since the melting point of the solder is 223° C., the reflow heating is performed at a temperature of 220° C. which is slightly lower than the melting point.

By this matter, the solder layer 26 does not spread around to the respective side faces of the columnar electrode 20 of the semiconductor chip 5 and the connection electrode 50 of the wiring substrate 6, but the solder layer 26 stays in the region between the columnar electrode 20 and the connection electrode 50 and is held in the region.

In this way, the underfill resin 60 contacts almost the entire side face of the columnar electrode 20 of the semiconductor chip 5. Moreover, the underfill resin 60 contacts almost the entire side face of the connection electrode 50 of the wiring substrate 6. Furthermore, the underfill resin 60 contacts the side face of the solder layer 26 as well.

Unlike this embodiment, in the case that the solder layer 26 formed at the tip end of the columnar electrode 20 of the semiconductor chip 5 is completely melted, the solder spreads around to the respective side faces of the columnar electrode 20 and the connection electrode 50 and covers them. By this matter, the solder formed on the respective side faces of the columnar electrode 20 and the connection electrode 50 contacts the underfill resin 60.

For this reason, when the semiconductor device is connected to the motherboard or the like by reflow soldering later, the solder formed on the respective side faces of the columnar electrode 20 and the connection electrode 50 is melted again. As a result, it is in a state the columnar electrode 20 of the semiconductor chip 5 and the connection electrode 50 of the wiring substrate 6 fall out easily from the underfill resin 60.

In view of the above point, when the columnar electrode 20 of the semiconductor chip 5 and the connection electrode 50 of the wiring substrate 6 are bonded each other by the solder, it is important that the solder is not completely melted, and the respective side faces of the columnar electrode 20 and the connection electrode 50 are made to contact directly to the underfill resin 60 without the solder.

Meanwhile, in the case that the wiring substrate 6a in FIGS. 8A and 8B mentioned above is used, the columnar electrodes 20 of the semiconductor chip 5 are similarly flap-chip connected to the connection electrode portions 50a of the wiring layers 56 of the wiring substrate 6a, and the underfill resin 60 is formed between the semiconductor chip 5 and the wiring substrate 6a.

In this embodiment, the solder layer 26 is formed at the tip end of the columnar electrode 20 of the semiconductor chip 5. Instead, a solder layer may be formed at the tip end of the connection electrode 50 of the wiring substrate 6, and the columnar electrode 20 of the semiconductor chip 5 may be connected to the connection electrode 50 of the wiring substrate 6 through the solder layer.

Moreover, the solder layer is illustrated as an example of the metal bonding material. A conductive paste or the like can be used instead.

Thereafter, as depicted in FIG. 12, the bonding tool 72 is detached from the semiconductor chip 5 of the structure in FIG. 11, and the wiring substrate 6 to which the semiconductor chip 5 connected is conveyed from the bonding stage 70 to the outside.

By the above steps, a semiconductor device 1 of the embodiment is obtained as depicted in FIG. 12.

As depicted in FIG. 12, the semiconductor device 1 of the embodiment includes the wiring substrate 6 including the connection electrodes 50 in FIG. 7B mentioned above, and the semiconductor chip 5 including the columnar electrodes 20 in FIG. 4B mentioned above. The connection electrodes 50 of the wiring substrate 6 and the columnar electrodes 20 of the semiconductor chip 5 are arranged so as to face each other, and the tip end of the connection electrode 50 and the tip end of the columnar electrode 20 are bonded by the solder layer 26.

In this way, the columnar electrodes 20 of the semiconductor chip 5 are flip-chip connected to the connection electrodes 50 of the wiring substrate 6 through the solder layer 26.

The height of the columnar electrode 20 of the semiconductor chip 5 is set higher than the height of the connection electrode 50 of the wiring substrate 6.

The cross-sectional shape of the connection electrode 50 of the wiring substrate 6 is the inverted trapezoidal shape in which the width W1 of the base end is narrower than the width W2 of the tip end (FIG. 7B). Also similarly, the cross-sectional shape of the columnar electrode 20 of the semiconductor chip 5 is the inverted trapezoidal shape in which the width W1 of the base end is narrower than the width W2 of the tip end (FIG. 4B).

Moreover, the underfill resin 60 is filled between the semiconductor chip 5 and the wiring substrate 6.

Then, almost the entire side face of the connection electrode 50 of the wiring substrate 6 is covered with the underfill resin 60 and contacts the underfill resin 60. Furthermore, almost the entire side face of each columnar electrode 20 of the semiconductor chip 5 is covered with the underfill resin 60 and contacts the underfill resin 60. The side face of the solder layer 26 between the connection electrode 50 and the columnar electrode 20 is also covered with the underfill resin 60.

In this way, since the connection electrode 50 of the wiring substrate 6 becomes narrower from the tip end toward the base end, the connection electrode 50 functions as the anchor to the underfill resin 60. By this matter, even when the thermal stress or the like is generated, it is prevented that the connection electrode 50 of the wiring substrate 6 falls out from the underfill resin 60. As a result, the detachment at the interface of the wiring substrate 6 and the underfill resin 60 is prevented.

Also similarly, since the columnar electrode 20 of the semiconductor chip 5 becomes narrower from the tip end to the base end, the columnar electrode 20 functions as the anchor to the underfill resin 60. By this matter, even when the thermal stress or the like is generated, it is prevented that the columnar electrode 20 of the semiconductor chip 5 falls out from the underfill resin 60. As a result, the detachment at the interface of the semiconductor chip 5 and the underfill resin 60 is prevented.

Accordingly, it is possible to improve the reliability of the electrical connection between the connection electrode 50 of the wiring substrate 6 and the columnar electrode 20 of the semiconductor chip 5.

The inventor of this application actually performed the moisture/reflow test and the high-temperature high-humidity test explained in the preliminary matter to the semiconductor device 1 of the embodiment. According to the results, the generation of the detachment was observed neither at the interface of the underfill resin 60 and the semiconductor chip 5 nor at the interface of the underfill resin 60 and the wiring substrate 6.

Accordingly, when the semiconductor device 1 is reflow-soldered to the mounting board such as a motherboard with the heat process, and when the electronic apparatus incorporating the semiconductor device is actually used, the sufficient reliability of the electrical connection can be ensured.

Figure 13:
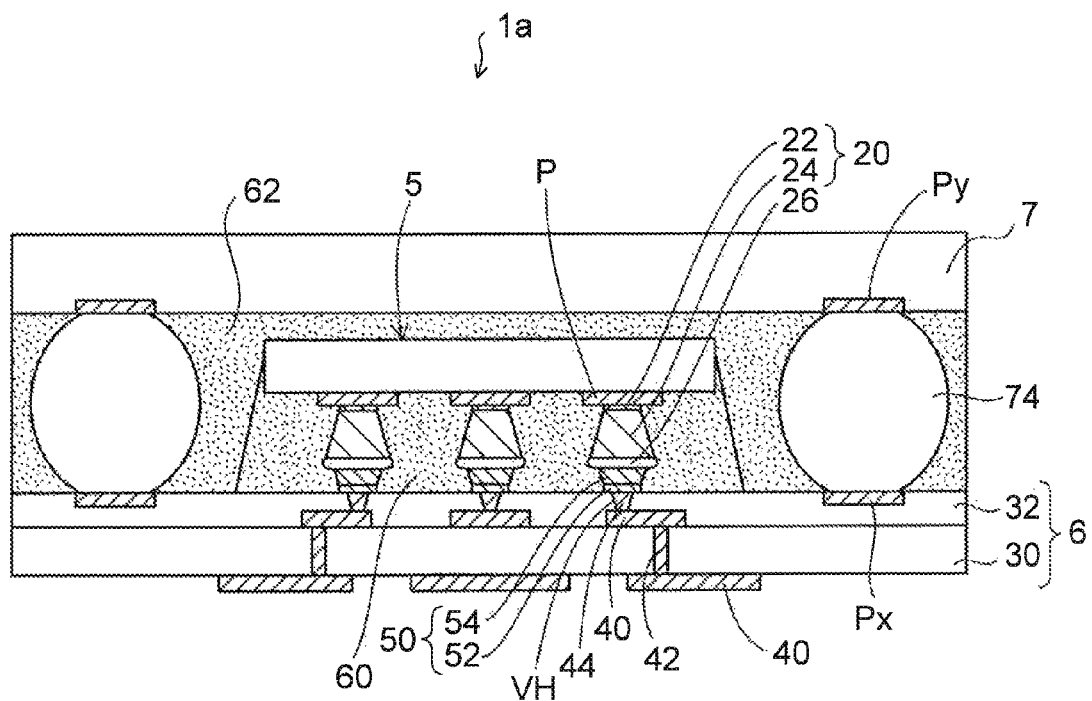
FIG. 13 is a cross-sectional view depicting a semiconductor device of the embodiment (part 2).

FIG. 13 depicts a semiconductor device 1a of a modification of the embodiment. As depicted in FIG. 13, in the semiconductor device 1a of the modification, the wiring substrate 6 of the semiconductor device 1 in FIG. 12 extends to the outside, and connection pads Px are formed on the wiring substrate 6 located to the lateral direction of the semiconductor chip 5.

Moreover, bump electrodes 74 formed of solder balls or the like are provided on the connection pads Px of the wiring substrate 6. The height of the bump electrode 74 is set higher than the height position of the upper face of the semiconductor chip 5.

Then, an upper wiring substrate 7 is arranged above the wiring substrate 6 and the semiconductor chip 5, the upper wiring substrate 7 which is electrically connected to the bump electrodes 74. Connection pads Py of the upper wiring substrate 7 are electrically connected to the connection pads Px of the wiring substrate 6 through the bump electrodes 74.

Further, another underfill resin 62 is formed between the semiconductor chip 5 and the upper wiring substrate 7 and between the wiring substrate 6 and the upper wiring substrate 7.

In the case of the semiconductor device 1a of the modification in FIG. 13, when the semiconductor device 1a is reflow-soldered to the mounting board such as a motherboard with the heat process, or the like, if the deformation such as the warp is generated in the upper wiring substrate 7, the stress that pulls upward is applied easily to the upper wiring substrate 7.

In this embodiment, since the columnar electrode 20 of the semiconductor chip 5 functions as the anchor to the underfill resin 60, it is effective particularly for the structure in which the stress that peels off the semiconductor chip 5 upward is applied, like the structure in FIG. 13.

In the embodiment described above, the semiconductor chip 5 is flip-chip connected on the wiring substrate 6. However, the semiconductor chips may be connected each other by using the similar electrode structure.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a semiconductor device, comprising:

preparing a wiring substrate including a first electrode in which a cross-sectional shape is an inverted trapezoidal shape;

forming a sealing resin material on a face of the wiring substrate on which the first electrode is formed;

preparing a semiconductor chip including a second electrode in which a cross-sectional shape is an inverted trapezoidal shape, and pushing the second electrode of the semiconductor chip into the sealing resin material, and pressure-welding the second electrode of the semiconductor chip to the first electrode of the wiring substrate through a metal bonding material; and performing a heat process, thereby bonding the second electrode of the semiconductor chip to the first electrode of the wiring substrate by the metal bonding material, and filling an underfill resin formed of the sealing resin material between the wiring substrate and the semiconductor chip, wherein a side face of each of the first electrode and the second electrode and a side face of the metal bonding material are covered with the underfill resin.

(Clause 2) The method of manufacturing a semiconductor device according to Clause 1, wherein in the forming the underfill resin, the metal bonding material is formed of a solder layer, and the heat process is performed at a temperature lower than a melting point of the solder layer.

(Clause 3) The method of manufacturing a semiconductor device according to Clause 1, wherein a height of the second electrode of the semiconductor chip is higher than a height of the first electrode of the wiring substrate.

(Clause 4) The method of manufacturing a semiconductor device according to Clause 1, wherein the first electrode of the wiring substrate is a pad-shaped electrode.

(Clause 5) The method of manufacturing a semiconductor device according to Clause 1, wherein the first electrode of the wiring substrate is an electrode portion defined in a part of a wiring layer which extends.

What is claimed is:

1. A semiconductor device, comprising:
a wiring substrate including a first electrode having a cross-sectional shape which is an inverted trapezoidal shape in which a width of a base end is narrower than a width of a tip end;
a semiconductor chip including a second electrode having a cross-sectional shape which is an inverted trapezoidal shape in which a width of a base end is narrower than a width of a tip end;
a metal bonding material bonding the tip end of the first electrode and the tip end of the second electrode which face each other; and
a first underfill resin filled between the wiring substrate and the semiconductor chip, the first underfill resin covering a side face of each of the first electrode and the second electrode and a side face of the metal bonding material.

2. The semiconductor device according to claim 1, wherein
the metal bonding material is formed of a solder layer, and
the solder layer is formed so as not to cover the side face of each of the first electrode and the second electrode.

3. The semiconductor device according to claim 1, wherein a height of the second electrode of the semiconductor chip is higher than a height of the first electrode of the wiring substrate.

4. The semiconductor device according to claim 1, wherein the first electrode of the wiring substrate is a pad-shaped electrode.

5. The semiconductor device according to claim 1, wherein the first electrode of the wiring substrate is an electrode portion defined in an extending part of a wiring layer.

6. The semiconductor device according to claim 1, further comprising:
a bump electrode arranged on the wiring substrate located to a lateral direction of the semiconductor chip, the bump electrode having a height higher than a height position of the semiconductor chip;
an upper wiring substrate arranged above the semiconductor chip, and electrically connected to the bump electrode; and
a second underfill resin formed between the semiconductor chip and the upper wiring substrate and between the wiring substrate and the upper wiring substrate.

* * * * *